(12) United States Patent
Lin

(10) Patent No.: US 6,285,582 B1
(45) Date of Patent: Sep. 4, 2001

(54) TWO-DIMENSIONAL RESONANT TUNNELING DIODE MEMORY SYSTEM

(75) Inventor: Hung Chang Lin, Silver Spring, MD (US)

(73) Assignee: Epitaxial Technologies, LLC, Baltimore, MD (US)

( * ) Notice: Subject to any disclaimer, the term of this patent is extended or adjusted under 35 U.S.C. 154(b) by 0 days.

(21) Appl. No.: 09/528,861

(22) Filed: Mar. 20, 2000

(51) Int. Cl.[7] .................................................. G11C 11/36
(52) U.S. Cl. ............................. 365/175; 365/71; 365/72; 365/168
(58) Field of Search .............................. 365/175, 71, 72, 365/168

(56) References Cited

U.S. PATENT DOCUMENTS 5,280,445 * 1/1994 Shieh et al. .......................... 365/175
5,572,626 * 11/1996 Lin et al. .................................. 395/3
5,654,921 * 8/1997 Sano .................................. 365/185.23
5,714,891 * 2/1998 Lin et al. ................................ 326/59
5,953,249 * 1/1994 Van Der Wagt ....................... 365/175

\* cited by examiner

*Primary Examiner*—Vu A. Le
*Assistant Examiner*—VanThu Nguyen

(57) ABSTRACT

A two-dimensional memory comprises a matrix of multi-valued resonant tunneling diodes (RTD). Each memory cell has two series RTDs with hysteretic folding V-I characteristics. The memory state is determined by the node voltage between the two RTDs and the series current. Each memory cell has two terminals connected to two bit lines through word line switches. The two bit lines are fed with two sets of multi-valued data and are written into the cell by two consecutive pulses to set the operating point. The two sets of multi-valued data are converted by two D/A converters from two sub-words of the binary digital word. The memory state is read by the sensing the voltages at the two terminals, or voltage at one terminal and the current through the other terminal.

18 Claims, 4 Drawing Sheets

TWO-DIMENSIONAL RESONANT TUNNELING DIODE MEMORY SYSTEM

BACKGROUND OF THE INVENTION (1) Field of the Invention

This invention relates a static memory architecture, in particular to a resonant tunneling diode multiple-valued memory system. This is a co-pending patent application of U.S. patent application Ser. No. 09/512,049.

(2) Description of the Related Art

In U.S. Pat. No. 5,280,445, a multiple-dimensional RTD memory cell was disclosed, where a single RTD memory cell can store a large number of states, as compared to a conventional binary memory cell, which can only store two states, namely: the "0" logic state and the "1" logic state.

An RTD has a folding voltage-current (V-I) characteristic as shown in FIG. 1, curve (a) where the positive slope of the V-I characteristic represents positive differential resistance and the negative slope of the V-I characteristic represents negative differential resistance. When the positive resistance is connected in series with the RTD, the positive differential resistance is increased and the negative differential resistance is reduced as shown in FIG. 1, curve (b). Further increase in the series resistance causes the V-I characteristic to yield a folding characteristic with hysteresis as shown in FIG. 2.

The multiple-dimensional RTD memory cell disclosed in U.S. Pat. No. 5,280,445 utilizes this hysteretic characteristic. When two RTDs RTDu and RTDd each with a one-peak hysteretic folding V-I characteristic are connected in series through a resistance R as shown in FIG. 3, the circuit becomes a 4-state memory cell. The cell can have four stable states as depicted in FIG. 4. The stable operating points are the intersections S1, S2, S3, S4 of the positive differential resistance sections of the folding characteristics. By applying two different voltages $V_H$ and $V_L$ across the resistance, the memory cell can be set (written) to the different memory states. In this figure, Vpu, Vvu, and Vpd. Vvd denote the peak and valley of RTDu and RTDd, respectively. During writing, when $V_L$ is less than Vp1, the positive differential resistance ra1 is effective, and when $V_L$ exceeds Vpd, rd2 is effective. Similarly, when $V_H$ is higher than Vpu, ru1 is effective, and when $V_H$ is less than Vpu, rub2 is effective. The stable operating points are determined by the intersections of the effective differential resistances. Thus, by applying different combinations of $V_L$ and $V_H$, the memory cell can be set to different memory states.

In a copending U.S. patent application, Ser. No. 09/512,049, it was disclosed that a 2-dimensional RTD memory cell can also be accessed by sensing its node voltage Vm and its series current Im, as shown in FIG. 5.

While the RTD memory cell was disclosed in the U.S. Pat. No. 5,380,445 and in the copending application Ser. No. 09/512,049, the architecture for incorporating the RTD memory cell was not disclosed.

SUMMARY OF THE INVENTION

An object of this invention is to disclose an architecture for incorporating RTD memory cells in a static memory system, in particular to a two-dimensional RTD memory. Another object of this invention is to design an RTD memory system to minimize the number of peripheral circuits and devices. Still another object of this invention is to design an RTD memory system wherein the memory cell is accessed by sensing two node voltages, or by sensing a node voltage and a series current during reading. A further object of this invention is to provide binary data input and store in the RTD memory cell as multiple-valued digital data.

These objects are achieved by placing the RTD memory cells at the cross-points of a memory matrix. Each memory cell has two inputs corresponding either to two node voltages $V_H$ and $V_L$ in FIG. 3 or two sequential node voltages: the pull-up voltage Vu and the pull-down voltage Vd in FIG. 5. The outputs of each cell are the node voltage Vm and Vi which is proportional to the series current Im.

For a multi-valued data input, the data can first be converted by an analog-to-digital converter (ADC) into binary data, which are split into two binary words. One binary word is reconverted by a digital-to-analog converter (DAC) into a first multi-valued data to serve as $V_H$ or Vu and the other binary word is reconverted into a second multi-valued data to serve as $V_L$ or Vd. The multiple-valued data are arranged as a two-dimensional X-Y matrix. Each X-value and a Y-value correspond to a unique memory state of the multiple-valued memory state.

The multi-valued data stored in the memory cell can be read by sensing the node voltage Vm and the series current Im. The multi-valued node voltage is converted as the one section (say MSB) of a binary word, and the multi-valued series current is converted as another section (say LSB) of the binary word. The two sections of the binary word are combined in an output DAC and converted into a multi-valued output.

For binary data input, the input ADC at the input can be eliminated. For binary output, the output DAC can be eliminated.

DETAILED DESCRIPTION OF THE INVENTION

Figure 1:
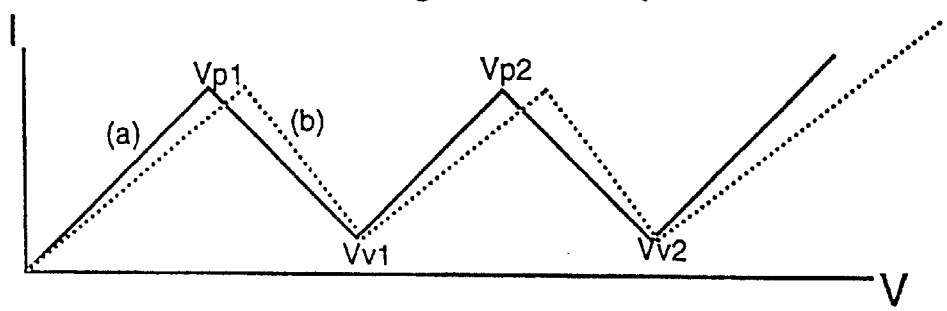
FIG. 1 shows the folding voltage-current (V-I) characteristic of an RTD.
Figure 2:
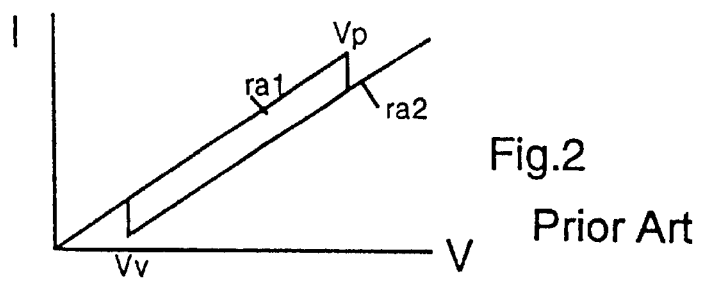
FIG. 2 shows the hysteresis V-I characteristic of a RTD.
Figure 3:
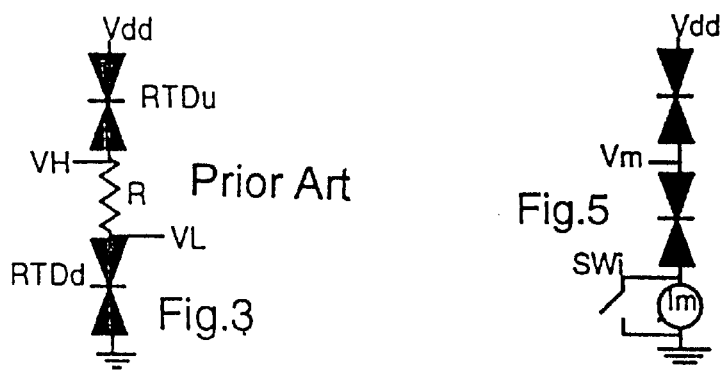
FIG. 3 shows a 2-RTD memory cell with a series resistor.
Figure 5:
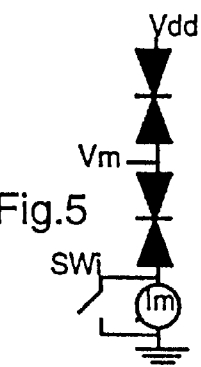
FIG. 5 shows a 2-RTD memory cell without a series resistor.
Figure 4:
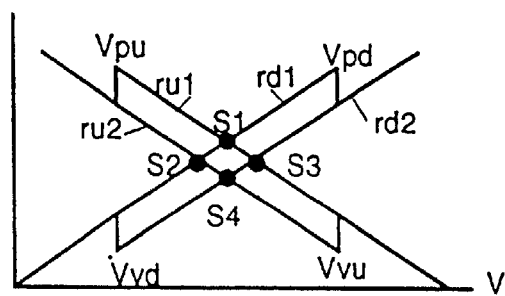
FIG. 4 shows the operation of the 2-RTD memory cell in FIG. 3
Figure 6A:
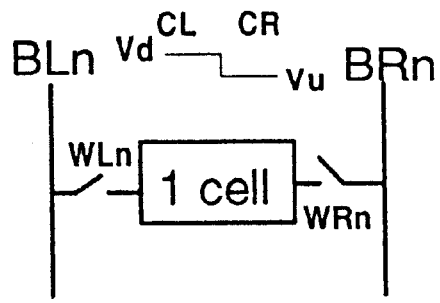
FIG. 6a shows a 2-dimensional RTD memory cell being accessed by two node voltages.
Figure 6B:
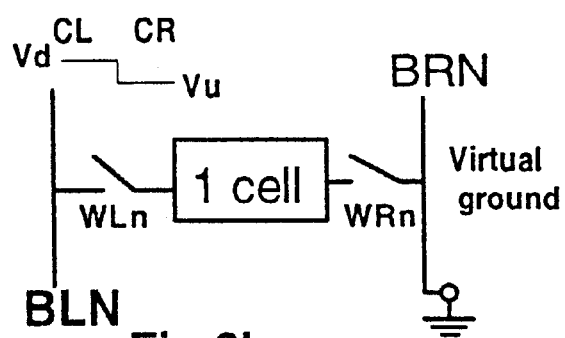
FIG. 6b shows the cell being accessed by a node voltage and a series current.

In FIGS. 3 and 5, it has been shown that each 2-dimensional RTD memory cell requires two input terminals. Any memory cell n therefore requires two bit lines BL and BR as shown in FIG. 6a and FIG. 6b. In FIG. 6a, the memory cell corresponds to that shown in FIG. 3. In FIG. 6b, the memory cell corresponds to that shown I FIG. 5.

Figure 7:
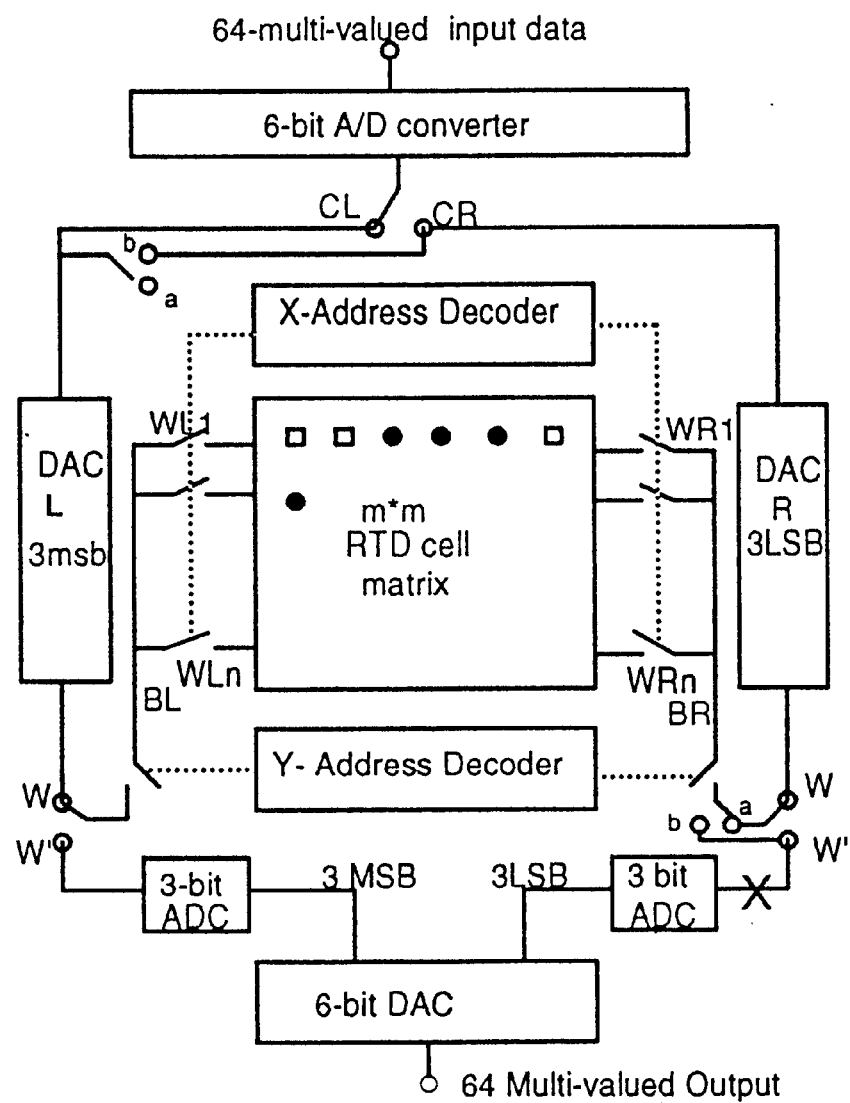
FIG. 7 shows a matrix for 2-dimensional memory cells organized for read-write operation for multiple-valued (MV) data.

FIG. 7 shows the organization of a multiple-valued memory cell matrix. In this figure, when the switches are in position "a", the memory cell shown in FIG. 6(a) is used. When the switches are in position "b", the memory cell shown in FIG. 6(b) is used. The following descriptions refer to FIG. 6(a). In FIG. 7, there are m rows and m columns. Since two bit lines are required for each memory cell, two switches WLn and WRn are used for each memory cell. A bank of WLn switches is connected to the common bit line BL, and a bank of WRn switches is connected to the common bit line BR. The WLn switches and the WRn switches are controlled by a common X-address decoder. A number of bit lines BL and BR are activated by a Y-address decoder. The memory cell is accessed by coincident X-Y addressing as in a conventional semiconductor memory. Thus any particular memory cell can be selected by its X and Y addresses. Since each memory cell is 2-dimensional, the memory states of the memory cell is determined by the combination of the multiple values L inputted from the switch WLm and the multiple values H inputted from the switch WRm. The maximum number of memory states is equal to the product L*R. If L=R=m, the decoder need only furnish m addresses instead of m*m addresses for the conventional one-dimensional memory cells.

Since the memory cell is multiple-valued, the data input from or output to the bit lines BL and BR should be multiple-valued. Thus, for H=R=m, the data should have m values. When the multiple-valued input data is a binary word, the input data should be decomposed into two multiple-valued components (sub-words) to actuate the two bit lines BL and BR. For instance, when the memory cell has 64 possible states, the bit line BL may have 8 multiple-values and the bit line BR may have 8 multiple values. The 64 values are converted by a analog-to-digital converter ADC into a 6-bit digital data, d1, d2, d3, d4, d5, d6. The most significant bits d1, d2 and d3 are converted by a 3-bit digital-to-analog converter DACL back to 8 multiple-valued data for driving the bit line BL. The least significant bits d4, d5, d6 are converted by another DACR to another 8 multiple-valued data for driving the bit line BR. Thus there can be 8*8 different combinations or 64 different memory states for each memory cell. The multiple-valued data on the BL line and the multiple-valued data on the BR line are applied sequentially.

For reading the memory state of a memory cell, the node voltage VL and the node voltage VR are sensed. The node voltage VL is conditioned to be 8-valued, and the node voltage VR is 8-valued. Each voltage VL and VR is separately converted by a 3-bit A/D converter ADCL and ADCR into two sub-words of the 3 most significant bits and least significant bits of a binary digital word. These two binary digital sub-words are combined as a binary digital word input to an output DAC. The output is then a multiple-valued stored data.

Figure 8:
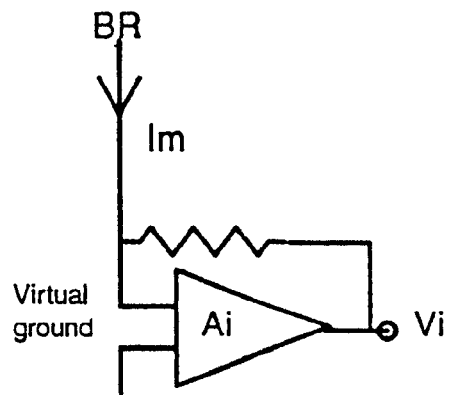
FIG. 8 shows a current to voltage converter when the memory cell shown in FIG. 5 is used.

The description of the foregoing paragraph is on the memory cell shown in FIG. 6a. When the memory cell shown in FIG. 6b is used, the operation is somewhat different with the switches in position "b". During writing, both the BL data and the BR data are fed to the same node sequentially and the right hand terminals of the memory cell are connected to ground as shown in FIG. 6b. During reading, the right hand terminals are connected to a current sensor as shown in FIG. 8, which can be a current-to-voltage converter using an operational amplifier A. The inverting terminal of the operational is at virtual ground, and the output is a voltage Vi proportional to the input current Im. This current to voltage converter is inserted at the point "X" for this mode of operation. The values of the node voltage Vm is converted by a 3-bit ADC to constitute the three most significant bits and the values of Vi is converted by another 3-bit ADC to constitute the three least significant bits. The three most significant bits and the three least significant bits are combined in a 6-bit DAC to yield a 6-bit 64 valued output.

Figure 9:
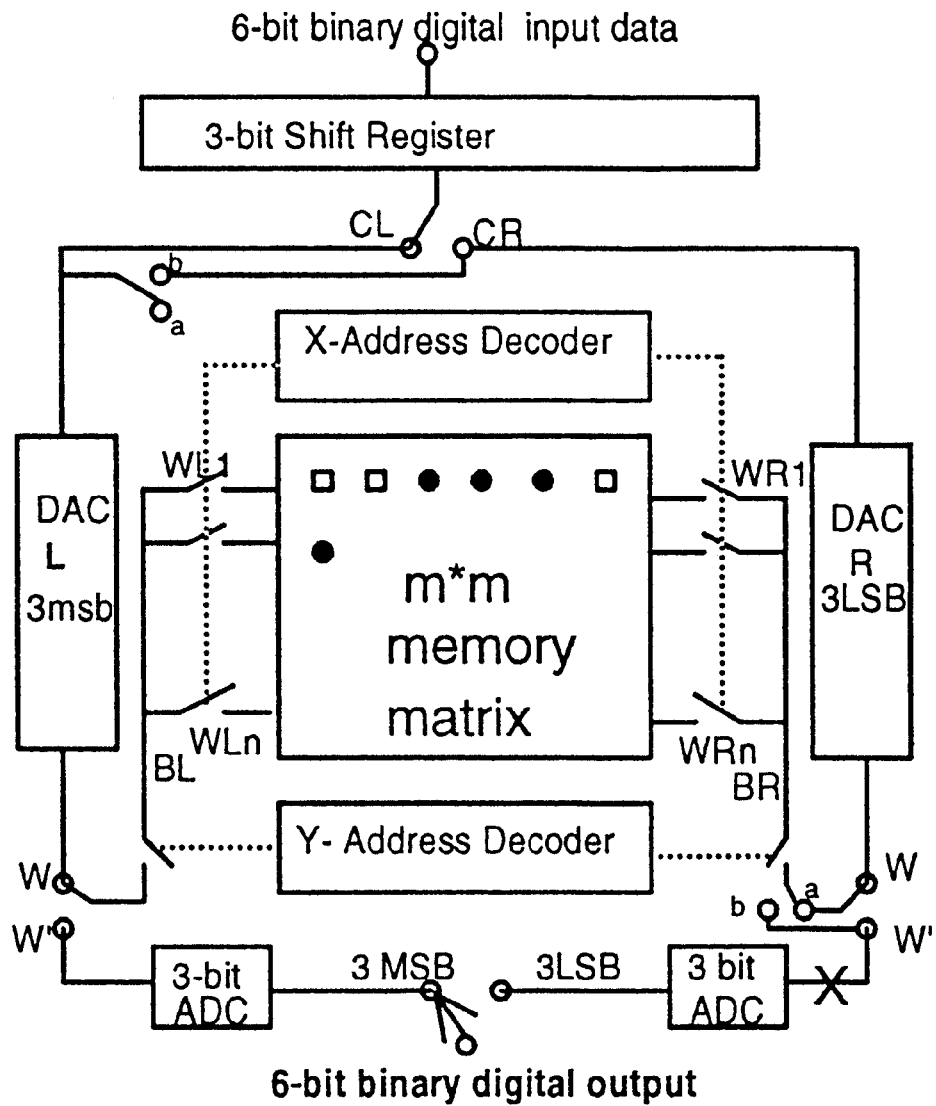
FIG. 9 shows the organization of the MV RTD memory matrix with binary data input.

For the case where the input data to the RTD memory is binary, the circuit shown in FIG. 8 can be simplified by eliminating the input ADC as shown in FIG. 9. Again use the 64 state (i.e. 6-bit binary states) multiple-valued memory cell as an example. The binary input data are fed to a 3-bit shift register RS3. When binary data are fed to RS3, a 3-bit binary word is outputted from RS3 and is converted by the DAC DACL into 8-valued data. When the next three bits of binary input data are fed to the shift register RS3, the next 3-bit output of RS3 is fed to the another DACR and converted into another 8-valued data. The rest of the operation is similar to that in FIG. 8. For binary digital output of the memory cell in FIG. 9, the output DAC in FIG. 8 is eliminated, since multiple-valued output data is no longer needed.

Figure 10:
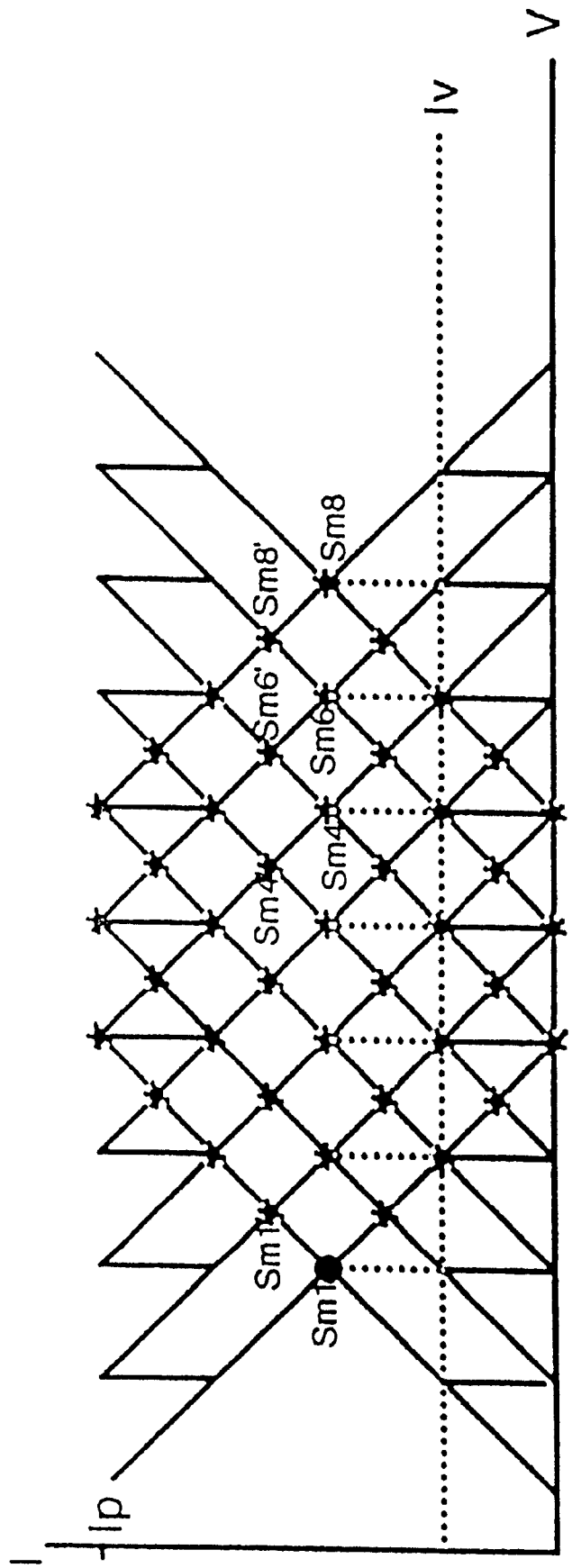
FIG. 10 shows the possible memory states for different number of current peaks and different values of valley current.

The number of memory states which can be realized depends on the number of peaks N of the folding V-I characteristics and the ratio of the peak to valley current ratio R=Ip/Iv. FIG. 10 is quantitative illustration of the situation. Let $\Delta Vp$ be the voltage between two voltage peaks, Nn be the ratio of a span of the positive slope to the pitch of the voltage peaks, $\Delta N$ be the number of peaks in excess of Nn (i.e $\Delta N=N-Nn$). Then for an ideal infinite R, it can be derived from FIG. 10 the total number of possibility memory states, as bounded between S1, Sm, Ip and Iv (=0 for ideal case), is:

$$Sm=(N+1)^2-\Delta N(1+\Delta N).$$

As an example, for R=∞, Nn=4

Sm4=25 when N=4, (bounded between Ip, Iv=0, S1 and Sm4);

Sm6=43 when N=6; (bounded between Ip, Iv=0, S1 and Sm6;

Sm8=61 when N=8, (bounded between Ip, Iv=0, S1 and Sm8

When R≠∞, $Sm=(Nn*R+1+\Delta N)^2-\Delta N(1+\Delta N)$

Then for R=4, Nn=4, the number of possible states as bounded between S1', Sm', Ip, and Iv', is:

Sm4'=16 when N=4; (bounded between Ip, Iv=Ip/4, S1' and Sm4');

Sm6'=30 when N=6; (bounded between Ip, Iv=Ip/4, S1' and Sm6')

Sm8'=44 when N=8, (bounded between Ip, Iv=Ip/4, S1' and Sm8'

Comparison With Binary SRAM Cell

From the foregoing description of the RTD memory architecture, one can make a comparison with conventional binary SRAM cell as shown in Table I.

A binary memory cell has only two memory states, while the RTD memory cell can have orders of more memory states, Therefore, for equivalent number of memory states, the number of RTD memory cells is much reduced. In Table I, the RTD memory cell is assumed to have 64 states. Then the number of RTD cells required is 64/2=32 times less.

The number of binary SRAM generally requires 6 FETs. In the RTD memory cell, there are two RTDs, two accessing leads and two power supply leads. The RTDs are vertically integrated. Therefore, the dimension of an RTD cell can only be no bigger and more likely smaller than the binary FET memory cell.

Each RTD memory is accessed in two dimensions. Therefore the number of decoders is much less than the one dimensional access of a binary cell. With two dimensional access, the number of decoders for each dimension is equal to the square-root of the number of memory cells.

It has been well established that the RTD has a much higher speed than FETs. With demand of higher speed ever increasing, the use of RTDs becomes more attractive.

Although the RTD memory architectures described includes a few extra ADC and DAC, they are one of a kind and does not occupy any appreciable amount of area.

TABLE I

BINARY MEMORY CELL vs MULTI-VALUED RTD MEMORY

| Memory States/cell | 2 | m(e.g. 64)# |
| --- | --- | --- |
| Memory capacity | $2^n$ (e.g. 1,048,576) | $2^n/(m/2)$ (e.g. 32769) |
| # Device/cell | 6 FETs | 2RTD + 2 FETs |
| Current/cell | 0 | 10 $\mu A$ |
| # Decoder FETS | $2 * 2^{n/2}$ (e.g. 2048) | $2 * [2^n/(m/2)]^{1/2}$ (e.g. 364) |
| Supply voltage | 5 V | <10 V |
| Cell size | 10 * 10 $\mu m^2$ | 10 * 10 $\mu m^2$ |
| Speed | Slower | GHz |

While the foregoing description uses a 64-valued RTD memory cell as an example. The method is applicable to other multiple-valued 2-dimensional memory cells. The method should also be applicable to a more-than-two-dimensional memory cell (i.e. more than two input/output terminals/cell) by decomposing an input binary word into more than two sub-words, converting each sub-word into multi-valued data and storing the multi-valued data in the multi-dimensional memory cell.

While particular embodiments of the invention have been described, it will be apparent t those skilled in the art that various modifications may be made in the embodiments without departing from the spirit of the present invention. Such modifications are all within the scope of this invention.

What is claimed is:

1. A multiple-valued memory system using a two dimensional memory cells each with a left (L)-terminal and a right (R)-terminal wherein the multiple-valued memory state is determined by the combination of the multiple values from the L-terminal and the R-terminal, comprising:

a matrix of said memory cells, a first bank of first word line switches each connected to said L-terminal;

a second bank of second word line switches each connected to said R-terminal;

a left bit line switch connected to said first bank of said first word line switches;

a right bit line switch connected to said second bank of second word line switches;

a first set of multiple-valued data fed to said left bit line;

a second set of multiple-valued data fed to said right bit line; and a left N-bit digital-to-analog converter (DAC) to provide left multiple-valued data sub-word for said left bit line, and a right N-bit DAC to provide right multiple-valued data sub-word for said right bit line during writing said memory.

2. The multiple-valued memory system as described in claim 1, wherein said left N-bit DAC and right N-bit DAC are fed from a 2N-bit binary digital word with N-bits sub-word inputting to said left DAC and another N-bits sub-word inputting to said right DAC.

3. The multiple-valued memory system as described in claim 1, wherein said 2N-bit digital word is derived from a 2N-bit shift register.

4. The multiple-valued memory system as described in claim 1, wherein said 2N bit digital word is derived from a N-bit shift register with binary digital output data alternately fed to said left DAC and said right DAC.

5. The multiple-valued memory system as described in claim 1, wherein said 2N-bit binary word is derived from an input analog-to-digital converter (ADC) with multiple-valued input data.

6. The multiple-valued memory system as described in claim 1, further comprising a left ADC to convert multiple-valued data from said left bit line to N-bits of binary digital sub-word of a 2N-bit binary digital word, and a right ADC to convert multiple-valued data from said right bit line to another N-bits of binary digital sub-word of said 2N-bit binary digital word when reading the memory.

7. The multiple-valued memory system as described in claim 1, further comprising a 2N-bit DAC to convert said 2N-bit binary digital word to multiple-valued data.

8. The multiple-valued memory system as described in claim 1, wherein said memory cell comprises a pull-up resonant tunneling diode (RTD) and a pull-down RTD in series having:

the common node between said pull-up RTD and said pull-down RTD connected to said L-terminal, and the ground terminal of said pull-down RTD connected to said R-terminal, said RTD having a multiple-peak hysteretic folding voltage-current (V-I) characteristic with multiple positive differential resistance regions.

9. The multiple-valued memory system as described in claim 1, wherein the memory state of said memory is determined by the node voltage and the series current of the pull-up RTD and the pull-down RTD.

10. The multiple-valued memory system as described in claim 9, wherein the memory state is set by applying to said left terminal a first writing pulse to select the positive differential region of the pull-down RTD and a second writing pulse to select the positive differential region of the pull-down RTD with said right terminal connected to a ground potential.

11. The multiple-valued memory system as described in claim 9, wherein the memory state is read by sensing the node voltage and the series current.

12. The multiple-valued memory system as described in claim 11 wherein said series current is sensed though said right bit line.

13. The multiple-valued memory system as described in claim 11, wherein said right bit line is at ground potential.

14. The multiple-valued memory system as described in claim 13, wherein said ground potential is furnished through a virtual ground as provided by an operational amplifier which converts said current into a voltage.

15. The multiple-valued memory system as described in claim 1, wherein said memory cell comprises: a pull-up RTD, a resistance, and a pull-down RTD connected in series between a high potential and ground potential with one end of said resistance connected to said left terminal and another end of said resistance connected to said right terminal, said RTD having a hysteretic folding voltage-current (V-I) characteristics with multiple positive differential resistance regions.

16. The multiple-valued memory system as described in claim 15, wherein the memory state of said memory is determined by the voltage at the left terminal and the voltage at the right terminal.

17. The multiple-valued memory system as described in claim 16, wherein the memory state is set by applying to said left terminal a first writing pulse to select the positive differential region of the pull-down RTD and a second writing pulse to select the positive differential region of the pull-up RTD.

18. The multiple-valued memory system as described in claim said memory state is read by the voltage at the left terminal and voltage at the right terminal.

* * * * *